United States Patent [19]

Sono

[11] Patent Number: 4,661,837
[45] Date of Patent: Apr. 28, 1987

[54] RESIN-SEALED RADIATION SHIELD FOR A SEMICONDUCTOR DEVICE

[75] Inventor: Michio Sono, Yamato, Japan

[73] Assignee: Fujitsu Limited, Kawasaki, Japan

[21] Appl. No.: 807,212

[22] Filed: Dec. 12, 1985

Related U.S. Application Data

[63] Continuation of Ser. No. 497,791, May 25, 1983.

[30] Foreign Application Priority Data

May 28, 1982 [JP] Japan .............................. 57-090684

[51] Int. Cl.⁴ ........................................... H01L 25/04
[52] U.S. Cl. ..................................... 357/84; 357/72; 357/70
[58] Field of Search ........................... 357/72, 84, 70

[56] References Cited

U.S. PATENT DOCUMENTS 4,300,153 11/1981 Hayakawa et al. ............... 357/72 X

FOREIGN PATENT DOCUMENTS

| 56-694650 | 7/1981 | Japan | 357/84 |
| 56-150837 | 11/1981 | Japan | 357/84 |
| 58-48950 | 3/1983 | Japan | 357/84 |
| 56176039 | 5/1983 | Japan | 357/84 |
| 8101345 | 5/1981 | PCT Int'l Appl. | 357/84 |

OTHER PUBLICATIONS

Nestork et al., "Captive Decal," *IBM Technical Disclosure Bulletin*, vol. 22, No. 8A, Jan. 1980, pp. 3136–3137.

Primary Examiner—Andrew J. James
Assistant Examiner—William Mintel
Attorney, Agent, or Firm—Staas & Halsey

[57] ABSTRACT

A resin-sealed type semiconductor device includes a semiconductor chip and a radiation shield film disposed in close contact with the surface of the chip. Internal leads are bonded to the electrodes on the chip and external leads are bonded to the internal leads. A sealing resin is molded around the chip, the radiation shield film, and the internal leads. A method for manufacturing the semiconductor device mentioned above includes the steps of mounting a semiconductor chip onto a film carrier, with the surface of the chip are in close contact with the radiation shield film of the film carrier. The electrodes on the chip are bonded to the internal leads supported by the film carrier separating the internal leads and the radiation shield film from the frame of the film carrier, thereby forming an intermediate assembly comprising the chip, the radiation shield film, and the internal leads. The intermediate assembly is mounted onto a lead frame, with the internal leads being bonded to the external leads of the lead frame and molding a sealing resin around the chip, the radiation shield film, and the internal fields, and separating the external leads from the frame portion of the lead frame.

7 Claims, 11 Drawing Figures

RESIN-SEALED RADIATION SHIELD FOR A SEMICONDUCTOR DEVICE

This is a continuation of co-pending application Ser. No. 497,791 filed on May 25, 1983.

BACKGROUND OF THE INVENTION (1) Field of the Invention

The present invention relates to a semiconductor device of the type sealed with resin and a method for manufacturing the same.

(2) Description of the Prior Art

In semiconductor memory devices having large capacities, "soft error" caused by radiation rays, in particular, alpha rays, has recently become a problem. This problem will become more serious with the increase in the degree of integration in semiconductor devices.

A variety of measures have been taken to cope with the problem caused by alpha rays, for example, designing the circuit so that the semiconductor chip itself exhibits resistance against alpha rays, protecting the surface of the semiconductor chip by a resin film, and reducing an amount of an alpha ray source contained in a sealing material. These measures, however, are not sufficiently effective. More effective measures have therefore been studied.

In a resin-sealed type semiconductor device, e.g., a resin-molded type semiconductor memory device, a semiconductor memory chip is sealed in a resin molded directly thereon, as is widely known. Fillers in the sealing resin contain alpha ray sources in large amounts. Therefore, as the integration degree of the device increases and memory cells are formed more finely, the problem of soft error becomes more serious.

In a conventional resin-sealed type semiconductor memory device, it has been attempted to apply a layer of resin without an alpha ray source onto the semi-conductor chip so as to block alpha rays. However, the resin layer applied has been too thin to achieve a sufficient shielding effect.

Moreover, in a conventional resin-sealed type semiconductor device, there is an additional problem that, according to the conventional method for manufacturing the device, after the step of molding the sealing resin, chip-stage bars of a lead frame are cut in the vicinity of the side surfaces of the sealing resin. Therefore, the ends of the chip-stage bars are exposed at the side surfaces of the sealing resin. Also, the cutting force and resultant mechanical impact create clearances between the chip-stage bars and the sealing resin. Moisture infiltrates into the chip surface through the clearances between the chip-stage bars and the sealing resin, thereby affecting the reliability of the device.

SUMMARY OF THE INVENTION

It is a primary object of the present invention to provide a resin-sealed type semiconductor device which features reduced soft error due to alpha rays, increased resistance against moisture, and, therefore, increased reliability.

Another object of the present invention is to provide a method for manufacturing the semiconductor device as mentioned above.

According to the present invention, there is provided a semiconductor device comprising a semiconductor chip having a surface in which at least a circuit element is formed and having a plurality of electrodes. A radiation shield film is disposed substantially in close contact with the surface of the circuit element of the chip. Internal leads are bonded to the electrodes of the chip and have inner ends supported by the radiation shield film. External leads are bonded to the internal leads and a sealing resin is molded around the semiconductor chip, the radiation shield member, and the internal leads.

According to the present invention, there is also provided a method for manufacturing the above-mentioned semiconductor device, comprising the steps of mounting a semiconductor chip on a film carrier, the chip having a surface in which at least a circuit element is formed and having a plurality of electrodes, the film carrier having a frame with an opening therein. A radiation shield film is disposed in the opening in the frame and partially connected to the frame, and a plurality of internal leads having outer and inner ends are supported by the frame and the radiation shield film, respectively, the radiation shield film being substantially in close contact with the surface of the circuit element of the chip. The internal leads of the film carrier being bonded to the electrodes of the chip and separating the internal lead and the radiation shield film from the frame of the film carrier, thereby forming an intermediate assembly comprising the semiconductor chip, the radiation shield film, and the internal leads. The intermediate assembly is mounted on a lead frame having a frame portion and a plurality of external leads supported by the frame portion, the external leads being bonded to the internal leads. A sealing resin is molded around the semiconductor chip, the radiation shield film and the internal leads and separates the external leads from the frame portion of the lead frame.

The present invention will now be described in detail based on preferred embodiments with reference to the accompanying drawings.

BRIEF DESCRIPTION OF THE DRAWINGS

FIGS. 3A, 3B, 3C, 3D, 3E, and 3F illustrate various steps in a method for manufacturing the device illustrated in FIG. 1, according to the present invention, wherein FIG. 3A is a sectional view taken along line A—A in FIG. 4, FIG. 3C is a sectional view taken along line C—C in FIG. 5, FIG. 3D is a sectional view taken along line D—D in FIG. 6, and FIG. 3F is a sectional view taken along line F—F in FIG. 2;

DESCRIPTION OF THE PREFERRED EMBODIMENTS

Figure 1:
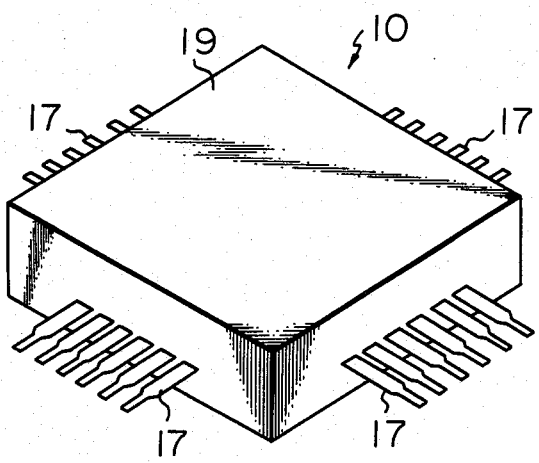
FIG. 1 is a perspective view of a semiconductor memory device according to the present invention.
Figure 2:
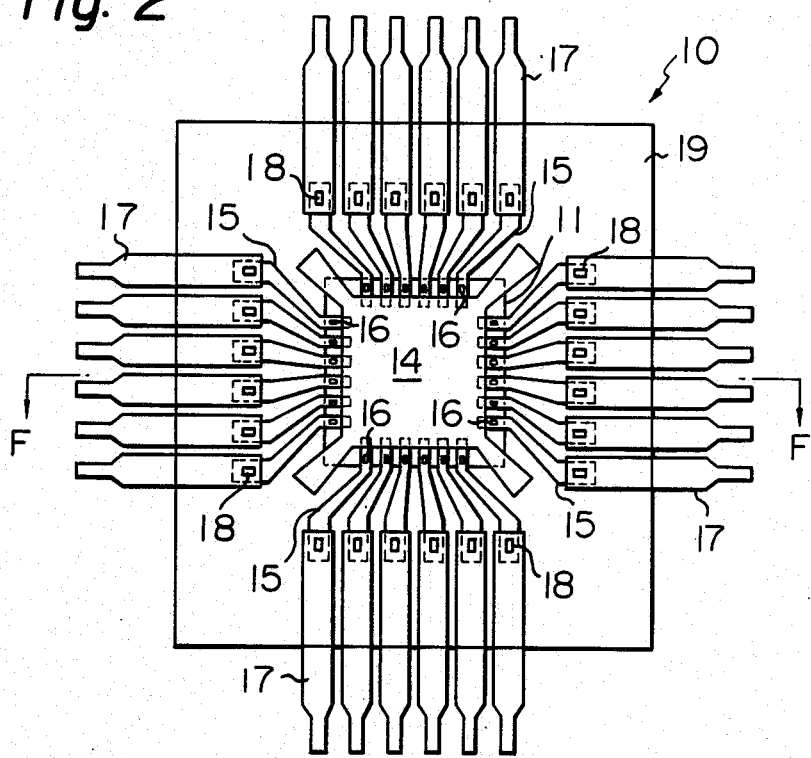
FIG. 2 is a bottom plan view of the device in FIG. 1, seen through the sealing resin thereof.
Figure 3A:
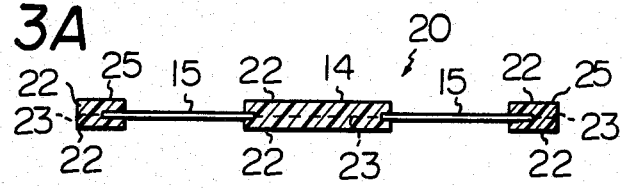
Figure 3B:
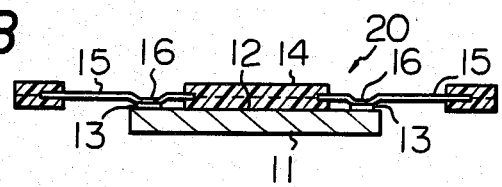
Figure 3C:
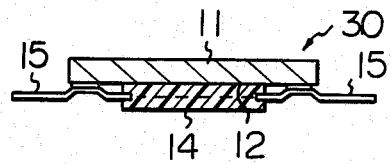
Figure 3D:
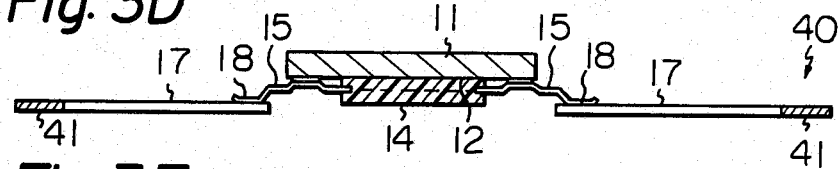
Figure 3E:
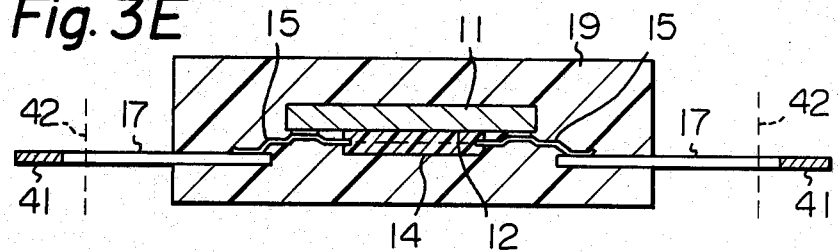
Figure 3F:
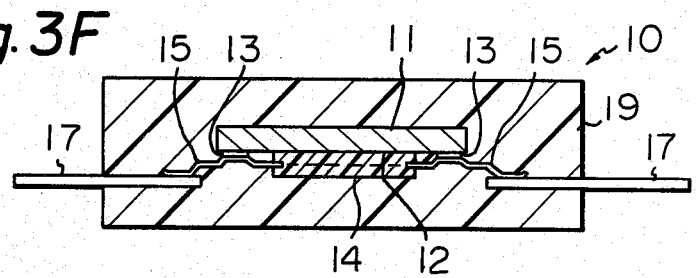

Referring to FIGS. 1, 2, and 3F, a semiconductor memory device designated generally by reference numeral 10 comprises, in general, a semiconductor memory chip 11, a radiation shield film 14, a plurality of internal leads 15, a plurality of external leads 17, and a sealing resin 19.

The semiconductor memory chip 11 has a surface 12 in which a plurality of memory cells (not illustrated) are formed. The memory chip 11 also has a plurality of electrodes or bonding pads 13 formed on a marginal area of the surface of the memory cells 12 thereof.

The radiation shield film 14 is made of a polymer material, for example, polyimide, and has a thickness of, for example, about 100 μm (microns). The radiation shield film 14 is disposed in close contact with the surface of the memory cells 12 of the chip 11 so that no gap is formed therebetween, and may be adhered to the chip surface 12 by a resin which does not contain an alpha ray source, for example, epoxy resin.

The internal leads 15 are bonded at the portions 16 thereof to the bonding pads 13 of the chip 11. The inner ends of the internal leads 15 are supported by the radiation shield film 14. The external leads 17 are bonded to the internal leads 15 at the portions 18.

The sealing resin 19 is molded around the chip 11, the radiaton shield film 14, the inner ends of said external leads and the internal leads 15, with the outer ends of the external leads 17 extending outward from the sealing resin 19.

A manufacturing process of the above-mentioned semiconductor memory device 10 according to the present invention will now be described with reference to FIGS. 3A through 3F and 4 through 6.

Figure 4:
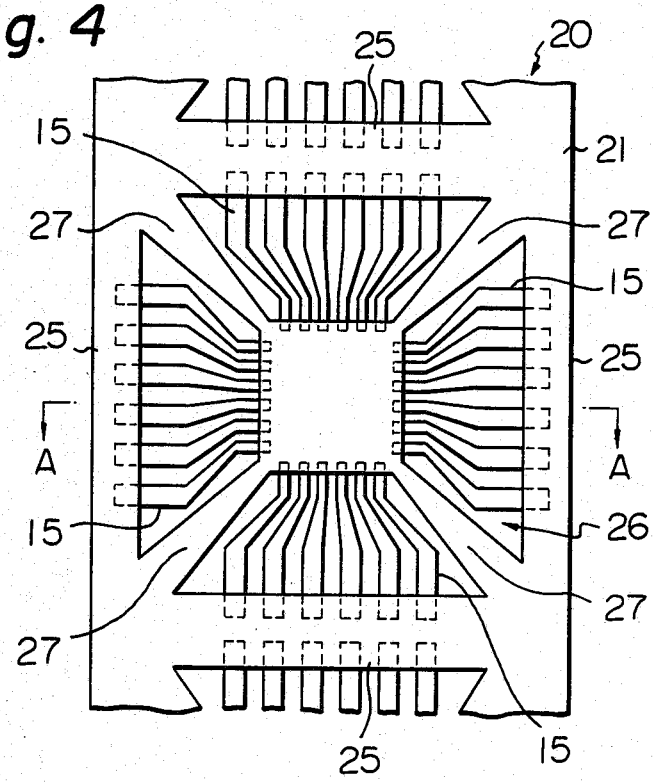
FIG. 4 is a partial top plan view of a film carrier.

In the method of the present invention, use is made of a film carrier, generally designated by reference numeral 20 in FIGS. 3A and 4. The film carrier 20 comprises a strip of film 21, which comprises two layers of polymer film 22, for example, polyimide films, adhered to each other by an adhesive and has a total thickness of, for example, about 100 μm. The film strip 21 has a frame 25, defining therein a series of openings generally designated by reference numeral 26, and a radiation shield film 14 disposed in each of the openings 26 and integrally connected to the frame 25 by means of connecting bars 27. The film carrier 20 further comprises groups of internal leads 15 supported by the film strip 21, with the outer and inner ends of the internal leads 15 of each group being held between the layers of films 22 of the film strip 21 at the frame 25 and the radiation shield film 14, respectively. The internal leads 15 are made of copper (Cu) or aluminum (Al) and are from 25 through 35 μm thick. The exposed portions of the internal leads 15 are plated with gold or silver.

Referring to FIG. 3B, the film carrier 20 is placed on a semiconductor memory chip 11, with the radiation shield film 14 in close contact with the surface of the memory cells 12 of the chip 11, and the internal leads 15 are thermo-compressively bonded to the bonding pads 13 of the chip 11 at the portions 16. Usually, all of the internal leads 15 are bonded at one time by a gang bonding method.

In order to ensure the close contact of the surface of radiation shield film 14 with the surface of the memory cells 12 of the chip 11, these surfaces may be adhered to each other with a resin without alpha ray sources, for example, an epoxy resin.

Figure 5:
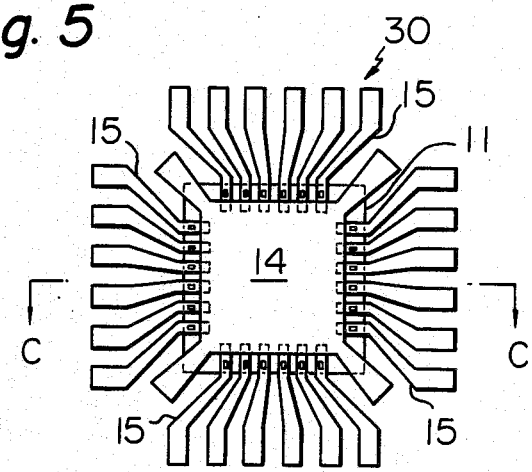
FIG. 5 is a bottom plan view of an intermediate assembly of the device.

Next, the internal leads 15 are cut in the vicinity of the frame 25 and, simultaneously, the connecting bars 27 are cut in the vicinity of the radiation shield film 14, thereby preparing an intermediate assembly 30 comprising the chip 11, the radiation field film 14 and the internal leads 15, as illustrated in FIGS. 3C and 5.

Figure 6:
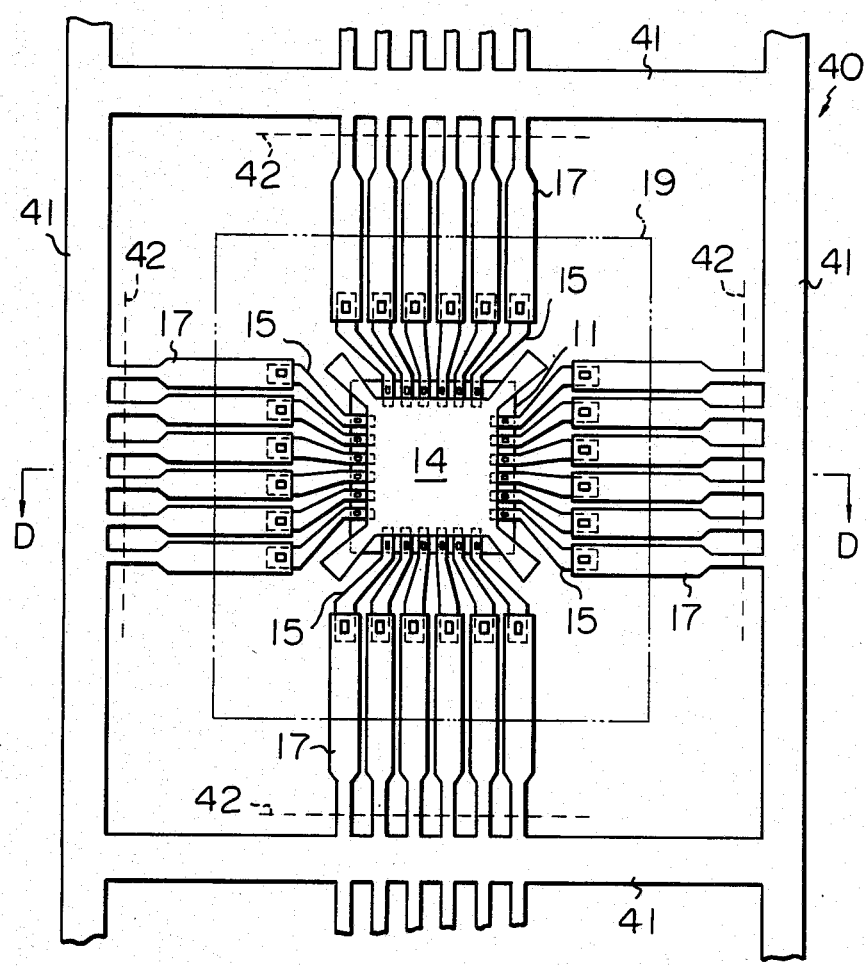
FIG. 6 is a bottom plan view of the intermediate assembly of the device bonded to a lead frame.

Referring to FIGS. 3D and 6, the intermediate assembly 30 is then mounted onto a lead frame 40. The lead frame 40 has a frame portion 41 and a plurality of external leads 17 extending inward from the frame portion 41 and is plated with gold or silver. The internal leads 15 are thermo-compressively bonded to the external leads 17 at the portions 18. Usually, the cutting of the internal leads 15 and the connecting bars 27 and the mounting of the intermediate assembly onto the lead frame 40, described above, are performed in continuously successive operations, as is widely known. Moreover, the bonding of the internal and external leads 15 and 17 is performed by a gang bonding method.

Thereafter, referring to FIGS. 3E and 6, a sealing resin 19 is molded around the chip 11, the radiation shield film 14, and the internal leads 15, by using a molding press in a customary manner. It should be noted that the sealing resin 19 is illustrated in a phantom line in FIG. 6.

Finally, the external leads 17 are cut in the vicinity of the dotted line 42 to be separated from the frame portion 41 of the lead frame 40, whereby the resin-sealed type semiconductor memory device 10 is manufactured.

As described above, in the resin-sealed type semiconductor device according to the present invention, the circuit element-formed surface of the semiconductor chip is in close contact with the radiation shield film. Accordingly, during the step of molding the sealing resin, the resin containing alpha ray sources does not flow onto the surface of the circuit elements of the semiconductor chip. Moreover, since the radiation shield film has a thickness of about 100 μm, the amount of alpha rays radiated from the molded resin and reaching the surface of the circuit elements of the semiconductor chip through the radiation shield film is greatly reduced. Therefore, "soft error" caused by alpha rays can be reduced.

Furthermore, the manufacturing method according to the present invention does not require use of a lead frame with a chip stage. Therefore, unlike a conventional construction, the resin-sealed type semiconductor device according to the present invention does not have a chip-stage bar exposed at the side surface of the sealing resin and, accordingly, exhibits increased resistance against humidity.

I claim:

1. A semiconductor device comprising:
   a semiconductor chip having a top surface in which a circuit having electrical elements is formed, and having a plurality of electrodes provided on the top surface of the semiconductor chip in which said circuit is formed;
   internal leads each having a central portion bonded to said electrodes of said semiconductor chip, said internal leads having first ends projecting inward in a substantially horizontal direction from said electrodes and having second ends projecting outward in a substantially horizontal direction from said electrodes;
   a radiation shield film having an area smaller than the area of said semiconductor chip, a portion of said radiation shield being arranged on and in close contact with said top surface of said semiconductor chip and adjacent to said first ends of said internal leads arranged thereon, supporting said first ends of said internal leads so that a gap is not formed therebetween, said first ends being inserted into said radiation shield film, said semiconductor chip being substantially supported by said internal leads and said radiation shield film;
   external leads having first ends bonded to said second ends of said internal leads; and a sealing resin molded around said semiconductor chip, said radiation shield film, said internal leads, and said first ends of said external leads, a portion of the surface of said chip directly opposite said top surface of said semiconductor chip and the surface of said radiation shield film farthest from said chip having said sealing resin formed directly thereon.

2. A semiconductor device according to claim 1, wherein said radiation shield film is a polymer film.

3. A semiconductor device according to claim 1, wherein said radiation shield film is a polyimide film.

4. A semiconductor device according to claim 1, wherein said radiation shield film comprises two layers of polyimide film adhered to each other.

5. A semiconductor device according to claim 4 wherein said first ends of said internal leads are located between said two layers of film of radiation shield film.

6. A semiconductor device according to claim 1, wherein said radiation shield film is adhered to the surface of said semiconductor chip by a resin, without employing a radiation source.

7. A semiconductor device according to claim 1, wherein said semiconductor chip is a semiconductor memory chip.

* * * * *

UNITED STATES PATENT AND TRADEMARK OFFICE
CERTIFICATE OF CORRECTION

PATENT NO. : 4,661,837
DATED : APRIL 28, 1987
INVENTOR(S) : MICHIO SONO

It is certified that error appears in the above-identified patent and that said Letters Patent is hereby corrected as shown below:

Col. 3, line 62, "field" should be --shield--.

Signed and Sealed this

Twenty-ninth Day of September, 1987

*Attest:*

DONALD J. QUIGG

*Attesting Officer*     *Commissioner of Patents and Trademarks*